United States Patent [19]

Miyake

[11] 4,183,061
[45] Jan. 8, 1980

[54] PHASE CONTROL OF PARABOLIC WAVE IN SPECIAL EFFECTS SYSTEM

[75] Inventor: Kazuhiko Miyake, Kawasaki, Japan

[73] Assignee: Tokyo Shibaura Electric Co., Ltd., Kawasaki, Japan

[21] Appl. No.: 874,517

[22] Filed: Feb. 2, 1978

[30] Foreign Application Priority Data

Feb. 4, 1977 [JP] Japan .................................. 52-11485

[51] Int. Cl.² .............................................. H04N 5/22
[52] U.S. Cl. .................................................... 358/183
[58] Field of Search ...................... 358/183, 181, 22; 315/370, 371; 328/155, 158, 13, 14, 21; 307/262

[56] References Cited

U.S. PATENT DOCUMENTS

3,715,487  2/1973  Blake ..................................... 358/183

FOREIGN PATENT DOCUMENTS

62027   6/1974  Japan ......................................... 358/183
120526 11/1974  Japan ......................................... 358/183

*Primary Examiner*—John C. Martin
*Attorney, Agent, or Firm*—Cushman, Darby & Cushman

[57] ABSTRACT

In a system for controlling the phase or peak portion of a continuous parabolic wave to move the center position of a circular or elliptical montage pattern on the picture screen of a television cathode ray tube, a fundamental parabolic wave with a fixed amplitude and phase and a sawtooth wave are generated at a constant repetition frequency (horizontal scanning frequency and vertical scanning frequency). At least the amplitude of the amplitude and polarity of the sawtooth wave is controlled in proportion to the position controlled variable of the montage pattern and then the sawtooth wave is mixed with the fundamental parabolic wave. A mixture of the horizontal parabolic and sawtooth waves is superposed on a mixture of the vertical parabolic and sawtooth waves, and then sliced to produce a montage pattern producing keying signal for combining two different video signals into one composite video signal.

29 Claims, 12 Drawing Figures

FIG. 1
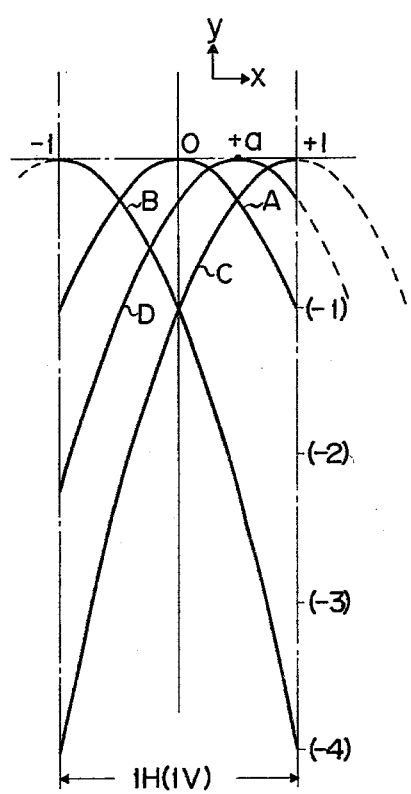
FIG. 3A
FIG. 3B
FIG. 3C
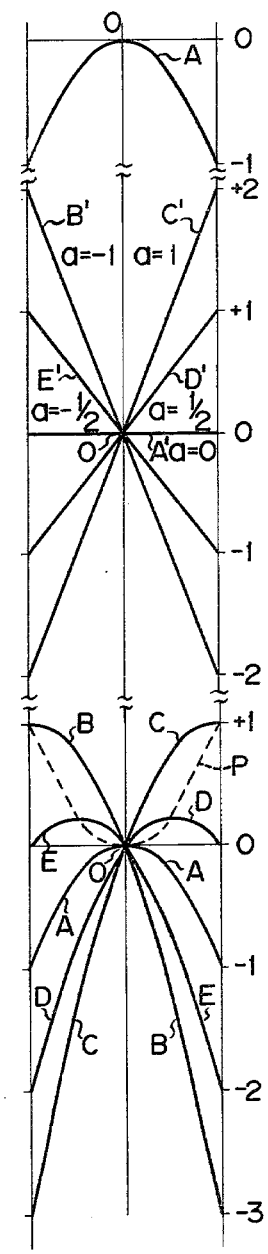

PHASE CONTROL OF PARABOLIC WAVE IN SPECIAL EFFECTS SYSTEM

BACKGROUND OF THE INVENTION

This invention relates to a video special effect producing system used in television studios, and more particularly to a system for controlling the phase or the peak position of a parabolic wave used to produce a circular or elliptical montage pattern on the screen of a television cathode ray tube.

As one example of video special effects a so-called wipe or montage effect is known in which is inserted in part of the television screen a picture which is different from a picture on the remaining part of the screen. Generation of a switching signal or keying signal for combining two kinds of video signals into one composite video signal is required to provide such video special effect. In a conventional special effect producing system for providing a typical circular montage pattern horizontal and vertical parabolic waves are generated at the horizontal line-scanning frequency and the vertical field-scanning frequency by horizontal and vertical drive pulses, and then mixed together. The mixed output of the horizontal and vertical parabolic waves is sliced by a slicer to produce a keying signal. When the horizontal and vertical parabolic waves each have a symmetric waveform a keying signal is generated which provides a circular wipe pattern centered at the center of screen. The size of the circular wipe pattern to at the center of screen. The size of the circular wipe is controlled by changing the slice level of the slicer by means of a fader operating device. The wipe pattern is moved up and down, and right and left, by adjusting a relative phase or a time relation between the horizontal and vertical drive pulses by means of position controllers connected to phase adjusting circuits for the horizontal and vertical drive pulses. The phase or the peak position of the parabolic wave so obtained is displaced with respect to the phase or the peak position of the parabolic wave for providing a circular wipe pattern centered at the center of screen.

In the above-mentioned special effect producing system in which the wipe pattern is moved by the phase adjustment of the horizontal and vertical drive pulses, when the center position of wipe pattern is shifted from the center of the screen, if the pattern is enlarged by the fader operating device, an unwanted twin pattern appears at the side opposite to that on which a desired pattern appears. In order to prevent such an unwanted twin pattern a waveform process or a twin pattern inhibiting process is usually effected which removes part of parabolic waveform of the horizontal parabolic wave and/or the vertical parabolic wave within each cycle period thereof. If the discontinuous parabolic wave obtained by such a waveform process is used, a distortion such as to make part of a circular pattern a straight line will occur dependent upon the position and size of the circular pattern. And further, when the pattern is positioned far away from the center of the screen, a complete change-over of screen from one picture image to another by means of fader control can not be achieved.

An elliptical pattern is obtained by changing the relative amplitude of the horizontal and vertical parabolic waves. The above-mentioned problems on the circular pattern also occur for the elliptical pattern.

In order to settle the above-mentioned problems it is necessary to provide horizontal and vertical parabolic waves whose instantaneous amplitude continuously varies during a substantially one cycle period even if the peak of the parabolic wave is at any point of time within one cycle period.

SUMMARY OF THE INVENTION

It is accordingly the object of this invention to provide a system for controlling the phase or peak position of a parabolic wave which is continuous during one cycle period, without the necessity of phase adjustments of horizontal and vertical drive pulses.

The above-mentioned object can be attained by mixing a parabolic wave component and sawtooth wave component. The parabolic wave component is generated at a predetermined frequency and has a constant amplitude and fixed phase, and the sawtooth wave component is generated at the above-mentioned predetermined frequency and at least the amplitude of the amplitude and polarity of the sawtooth wave component is controlled according to a linear function of the position controlled variable of a circular or elliptical wipe pattern.

According to a first embodiment of this invention a parabolic wave component has a constant amplitude and symmetric waveform, and a saw-tooth wave component has its amplitude and polarity controlled according to the position controlled variable of the wipe pattern. The parabolic wave component and sawtooth wave component are mixed together to obtain a mixed output. The peak level of the mixed output is clamped to a predetermined potential.

According to a second embodiment of this invention a parabolic wave component having a constant amplitude and a peak at one end of one cycle period, and a sawtooth wave component substantially opposite in phase to the parabolic wave and having only its amplitude controlled according to the position control amount of the wipe pattern are mixed together. The peak level of the mixed output is clamped to a predetermined potential.

According to a third embodiment of this invention a parabolic wave component having a constant amplitude and symmetrical waveform, and a sawtooth wave component having a DC component proportional to the position controlled variable of the wipe pattern superposed thereon and its amplitude and polarity controlled according to the position controlled variable are mixed together.

According to a fourth embodiment of this invention a parabolic wave component having a constant amplitude and a peak at one end of one cycle period, and a sawtooth wave component having a DC component depending on the position controlled variable of the wipe pattern superposed thereon and having only its amplitude controlled according to the position controlled variable are mixed together.

BRIEF DESCRIPTION OF THE DRAWINGS

FIG. 1 shows the waveforms of desired parabolic waves for moving the central position of a circular wipe pattern;

FIGS. 3A, 3B and 3C show waveforms at parts of FIG. 2;

DESCRIPTION OF THE PREFERRED EMBODIMENTS

Figure 2:
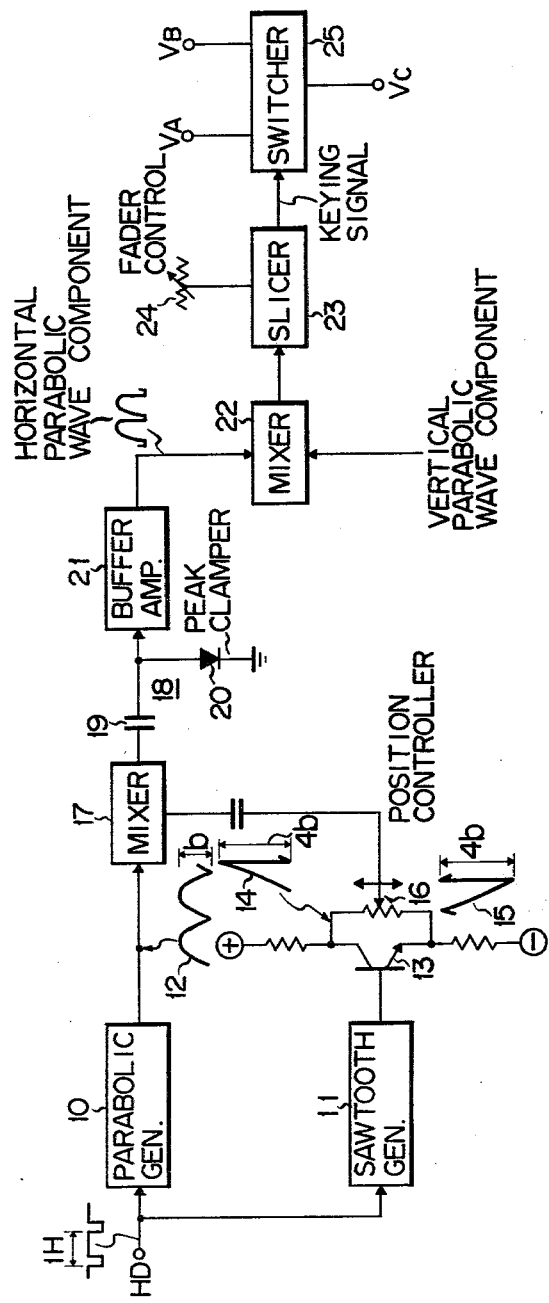
FIG. 2 is a schematic block diagram of a system for controlling the phase of parabolic waveforms in accordance with a first embodiment of this invention.

FIG. 1 shows the waveforms of desired parabolic waves whose instantaneous amplitudes continuously vary during a substantially one horizontal line-scanning cycle period 1H (63.5 μs) and a substantially one vertical field-scanning cycle period 1V (1/60 sec) irrespective of their peak positions, the parabolic waves being used for circular wipe patterns centered at various points on the screen of a television cathode ray tube. For convenience of explanation, suppose that the center of the screen is 0 with the left and right ends (upper and lower ends) of the screen representing −1 and +1, respectively with respect to position controlled variables of a wipe pattern. A parabolic waveform for a circular wipe pattern whose center aligns with the center of the screen is designated by A and the parabolic waveform A is assumed to have an amplitude of 1. B indicates a parabolic wave for a wipe pattern whose center is located at a horizontal scanning starting end or a vertical scanning starting end, namely, at the left end or upper end of the screen (in this case, the left half or the upper half of the circular wipe pattern does not appear on the screen) and the amplitude of parabolic wave B is four times that of the parabolic wave A. C indicates a parabolic wave for a wipe pattern whose center is located at the right end or the lower end of the screen (in this case, the right half or the lower half of the circular pattern does not appear on the screen) and the amplitude of parabolic wave C is four times that of the parabolic wave A.

A parabolic wave D for a wipe pattern centered at a given point a may be expressed as follows using an X-Y cordinate shown:

$$y = -(x-a)^2 \quad (1)$$

In Equation (1), when -a=0, y corresponds to the parabolic wave A; when a=−1, y corresponds to the parabolic wave B; and when a=+1, y corresponds to the parabolic wave C.

Equation (1) can be expanded as follows:

$$y = -x^2 + 2ax - a^2 = yA + 2ax - a^2 \quad (2)$$

Where yA denotes the symmetric, parabolic wave A ($-x^2$). From Equation (2) it will be understood that the various parabolic waves of FIG. 1 can be obtained by superposing a sawtooth wave component ($2ax$) and DC component ($-a^2$) on the symmetrical parabolic wave A with a constant amplitude, the amplitude and polarity of the sawtooth wave component varying dependent upon a controlled variable a given by a position controller. The amplitude of the sawtooth wave is determined by difference between values of $2ax - a^2$ (a=1) obtained when x is 1 and −1, respectively, and thus may be four times that of the parabolic wave A.

A system according to one embodiment of this invention for controlling the phase of continuous parabolic waves at will by mixing, as mentioned above, a parabolic wave having a constant amplitude and symmetrical waveform and a sawtooth wave of which the amplitude and polarity are varied by the position controller, will now be explained below with reference to FIG. 2.

In this embodiment, the necessity of superposition of the DC component ($-a^2$) is settled by clamping a peak level of a mixed output of the parabolic wave and sawtooth wave to a given level. As described before, a keying signal for combining two kinds of video signals into one composite video signal can be obtained by slicing a mixed output of horizontal and vertical parabolic components. Since the vertical and horizontal parabolic components can be obtained in the same method, this invention will be explained below only in connection with the horizontal parabolic wave component.

Referring to FIG. 2 a horizontal drive pulse HD of 15.75 KHz used in television studios is applied to a parablic wave generator 10 and sawtooth generator 11 to generate a fundamental parabolic wave and sawtooth wave which have one cycle period of 63.5 μs. The parabolic wave generator 10 is arranged to produce the fundamental parabolic wave 12 having a constant amplitude b and symmetrical waveform as shown in FIG. 2. The output of the sawtooth wave generator 11 is applied to the base of a transistor 13 connected between positive and negative supply terminals of a power source to develop two sawtooth waves 14 and 15 at the collector and emitter of transistor 13, respectively. The two output sawtooth waves of the transistor 13 have a constant amplitude 4b and are opposite in polarity to each other and, according to the above-mentioned position controlled variable a, they are variably mixed by a wipe pattern position control potentiometer 16 connected between the collector and emitter of transistor 13. The output of the parabolic wave generator 10 and output of the sawtooth amplitude/polarity controller or position controller 16 are mixed together in a mixer 17. The output of the mixer 17 is applied to a peak clamper circuit 18 comprised of, for example, a capacitor 19 and diode 20 to clamp the peak level of the mixture of parabolic and sawtooth waves to a predetermined potential (ground potential in this case). The output of the peak clamper circuit 18, which is the mixture of horizontal symmetrical parabolic wave and horizontal sawtooth wave, is coupled through a buffer amplifier 21 to a mixer 22 where it is mixed with a vertical parabolic wave component which is obtained from 60 Hz vertical drive pulse VD in the same method as in the case of the above-mentioned horizontal component. The output of the mixer 22 is fed to a slicer 23 and sliced at a proper level to generate a keying signal. The keying signal is delivered to a switcher 25 to combine two kinds of video signals $V_A$ and $V_B$ into one composite video signal $V_C$. For the size of the circular wipe pattern to be adjusted, a fader control 24 for controlling the slice level of the output of the mixer 22 is connected to the slicer 23. When a slider of the position controller or a potentiometer 16 is at the uppermost position, a parabolic wave corresponding to the parabolic wave C of FIG. 1 appears at the output of the mixer 17. With the slider of the position controller 16 at the lowest position, a wave corresponding to the parabolic wave B appears at the output of the mixer 17. When the slider is at the center position, the sawtooth waves 14 and 15 are cancelled out with respect to each other and thus the symmetrical parabolic wave A appears at the output of mixer 17.

The peak levels of the various parabolic wave outputs vary, as will be later described, dependent upon the position control amount of the wipe pattern by means of the position controller 16. FIG. 3A shows the output A of the parabolic wave generator 10. FIG. 3B shows various sawtooth wave outputs which are to be mixed with the symmetrical parabolic wave A with the position controlled variable a of the position controller 16 taken as a parameter. In FIG. 3B, a waveform C' shows a sawtooth wave output when the slider of position controller 16 is at the uppermost position; a waveform B' shows an output when the slider is at the bottom position; a waveform A' shows an output when the slider is at the center position; and waveforms D' and E' show sawtooth wave outputs when the position controlled variables a are $\frac{1}{2}$ and $-\frac{1}{2}$, respectively. FIG. 3C shows resultant horizontal parabolic wave components of the mixer 17. The parabolic waves A, B, C, D and E of FIG. 3C correspond to waveforms A', B', C', D', and E', respectively and it will be evident that the peak level of the resultant parabolic wave output varies dependent upon the position controlled variable a. The dashed line P of FIG. 3C shows the locus of the peak of each parabolic wave output, and the locus draws a parabola of $a^2$. The fact that the peak level of the parabolic wave output is varied by the position control means that the pattern size will vary as the wipe pattern is moved.

In the embodiment shown in FIG. 2 the peak clamper circuit 18 is provided at the output side of the mixer 17 and the peaks of the parabolic wave outputs are fixed at a predetermined potential or ground potential. In consequence, the above-mentioned drawback can be eliminated.

The above-mentioned Equation (2) can be rearranged as follows:

$$y = -(x+1)^2 + 2(a+1)x - (a^2-1) \qquad (3)$$

Figure 4:
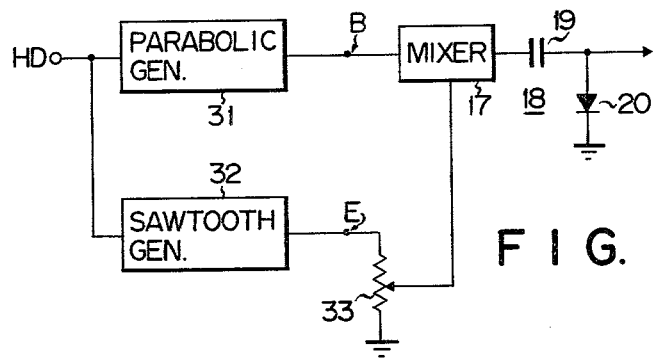
FIG. 4 is a schematic block diagram of a second embodiment of this invention.
Figure 5A:
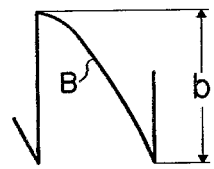
FIGS. 5A and 5B show waveforms for explaining the operation of the system of FIG. 4.
Figure 5B:
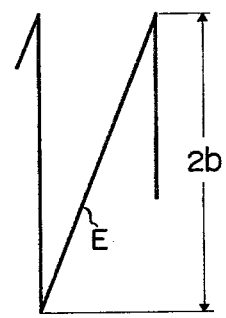

The first term on the right hand side of Equation (3) shows the parabolic wave B of FIG. 1; the second term shows a sawtooth wave component of which the amplitude alone is varied by the position controlled variable a ($-1 \leq a \leq 1$); and the third term shows a variable DC component. In consequence, the phase of the parabolic wave can be controlled by mixing the parabolic wave B with the fixed amplitude and phase and the sawtooth wave of which the amplitude varies dependent upon the position control amount. FIG. 4 shows a second embodiment of this invention which is based on the above-mentioned concept. In response to the horizontal drive pulse HD a parabolic wave generator 31 of FIG. 4 generates a parabolic wave B of an amplitude b, of which the peak is at the beginning of one cycle period as shown in FIG. 5A, and a sawtooth wave generator 32 of FIG. 4 generates a sawtooth wave E having an amplitude 2b and a phase substantially opposite to that of the parabolic wave B i.e. a waveform whose instantenous amplitude is increased, contrary to the parabolic wave B, over one cycle period with time. The sawtooth wave E is fed, after its amplitude is controlled by a position controller 33, to the mixer 17 where it is mixed with the parabolic wave B. Also in this embodiment the peak level variation of the output of mixer 17 is eliminated by the peak clamper 18 comprised of the capacitor 19 and diode 20. As a modification of this embodiment it is possible to mix the parabolic wave C as shown in FIG. 1 and a sawtooth wave which is substantially opposite in phase to the parabolic wave C and of which the amplitude is controlled by the position controller.

In the above-mentioned embodiments using the peak clamping circuit, the waveform of the resultant parabolic wave is liable to be distorted due to conduction of the diode 20, thus making it difficult to obtain a complete circular pattern. A peak clamper circuit generally exhibits a slow response to a rapid input variation, and in consequence a rapid wipe pattern position control results in a temporary pattern size variation.

Figure 6:
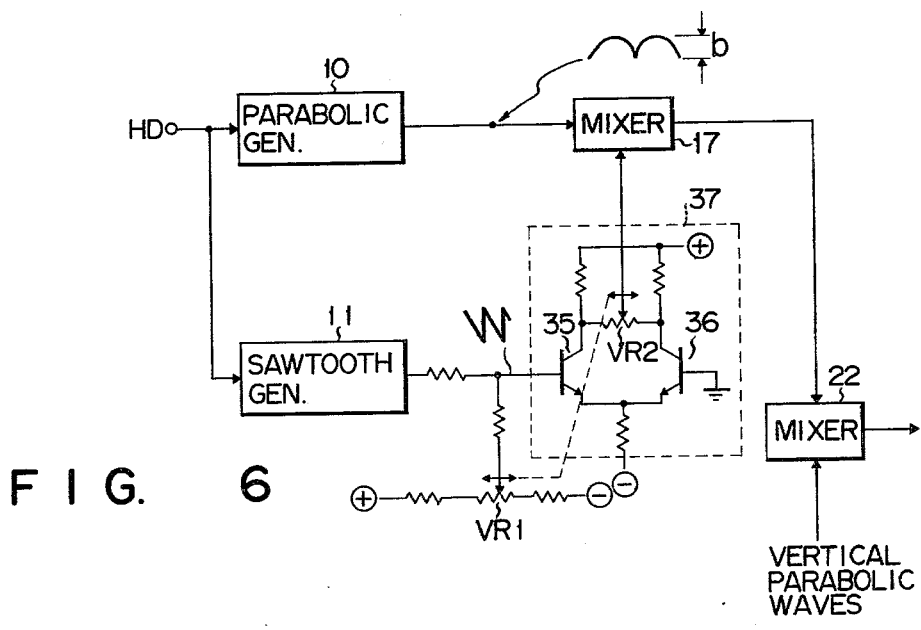
FIG. 6 is a schematic block diagram of a third embodiment of this invention.

FIG. 6 shows a third embodiment of this invention, corresponding to the first embodiment of FIG. 2, which obviates the necessity of providing a peak clamper circuit. The embodiment of FIG. 6 is designed based on the modified Equation (2):

$$y = yA + 2ax - a^2 = yA + a(2x-a)$$

Figures 7A, 7B, 8:
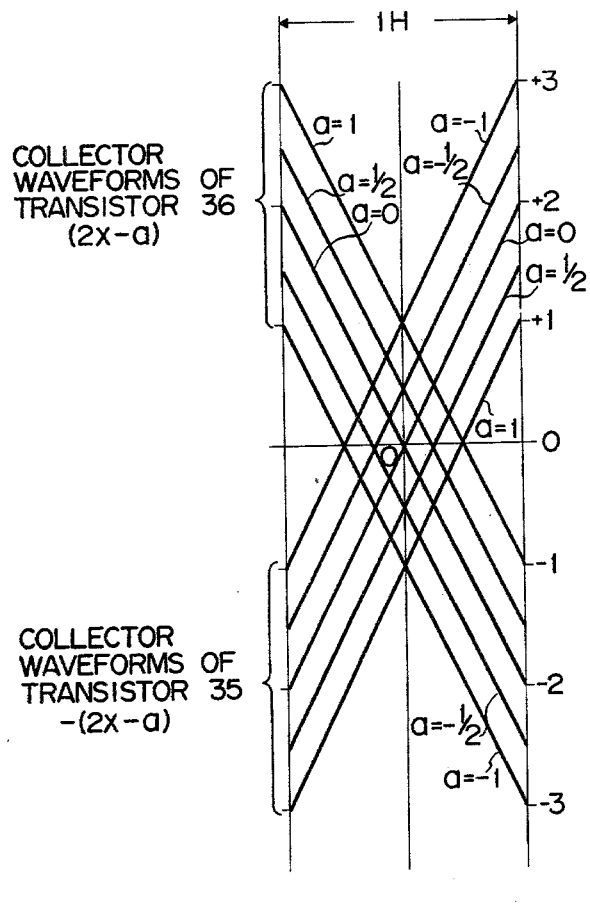
FIGS. 7A and 7B are waveforms for explaining the operation of the system of FIG. 6.
FIG. 8 is a schematic block diagram of a fourth embodiment of this invention.

The embodiment of FIG. 6 has the feature of superposing on the parabolic wave A a component a (2x−a) obtained by controlling, according to the position control amount a, the amplitude and polarity of the sawtooth wave component (2x−a) having a DC component proportional to the position control amount superposed. That is, a DC voltage which is caused to be linearly proportional to the position control amount a by a positional controller $VR_1$ connected between the positive and negative supply terminals of a DC power source is superposed on a sawtooth wave of an amplitude 4b which comes from the sawtooth generator 11. The DC superposed sawtooth wave is applied to the base of a transistor 35 which forms together with a base-grounded transistor 36 a differential amplifier 37 connected between positive and negative supply terminals of a DC power source. Between the collectors of transistors 35 and 36 a variable resistor $VR_2$ is connected which is ganged with the variable resistor $VR_1$. An output −(2x−a) appears at the collector of transistor 35 and output (2x−a) appears at the collector of transistor 36. A component a(2x−− a) whose polarity and amplitude vary dependent upon the position control amount is derived from the variable resistor $VR_2$ and then mixed in a mixer 17 with a horizontal symmetrical parabolic wave. When the sliders of the variable resistors $VR_1$ and $VR_2$ are both at the left hand end position shown, the position control amount a is 1 (at this time, the center of a wipe pattern is at the right end position of the screen) and when the sliders of the variable resistors $VR_1$ and $VR_2$ are both at the center position, the position 21 amount a is 0 (at this time, the center of the wipe pattern is at the center of the screen). With the sliders of the variable resistors $VR_1$ and $VR_2$ both at the right hand end position, the position control amount a is −1 and the center of the wipe pattern is at the left hand end position of the screen. FIG. 7A shows the waveform group of the outputs −(2x−a) and (2x−a) at the collectors of the transistors 35 and 36 with the position control amount a taken as a parameter. FIG. 7B shows the waveform group of the outputs of the position controller $VR_2$ with the position control amount a taken as a parameter. A midpoint 0 on the ordinate of FIG. 7A means a specified DC potential, not a zero potential.

Since in the circuit of FIG. 6 the DC component ($-a^2$) of FIG. 2 has been inserted into the sawtooth wave component with which the parabolic wave A is mixed, no peak clamper circuit is required as in the above-mentioned embodiments. In the circuit shown in FIG. 6 quadratic function control with respect to the position control amount a for producing the DC component ($-a^2$) is not effected and linear function controls alone are effected.

The above-mentioned Equation (2) can be rearranged as follows:

$$y = -(x+1)^2 + (a+1)(2x-a+1) = yB + (a+1)(2x-a+1).$$

Therefore, it is also possible to provide a fourth embodiment, as shown in FIG. 8, corresponding to the embodiment of FIG. 4. That is, before the output of the sawtooth generator 32 is applied to the base of a transistor 38 a DC voltage corresponding to $-a+1$ is superposed by the variable resistor $VR_1$ on the sawtooth wave, and then the sawtooth wave is subjected, by the variable resistor $VR_2$ connected to the emitter of emitter follower transistor 38, to an amplitude control dependent on $a+1$. The amplitude-controlled sawtooth wave is mixed in the mixer 17 with the parabolic wave B.

Although specific embodiments have been explained with reference to the accompanying drawing, this invention is not limited to the precise embodiments and various variations or modifications may be effected therein by one skilled in the art without departing from the scope or spirit of the invention as defined in the appended claims.

What is claimed is:

1. A method for controlling the phase of a continuous parabolic wave for use in provision of a circular or elliptical montage pattern on the screen of a television cathode ray tube to move the center position of the montage pattern by means of position control means comprising the steps of:
   generating a fundamental parabolic wave with a fixed amplitude and phase at a constant repetition frequency;
   generating a sawtooth wave at said constant repetition frequency;
   controlling the amplitude of said sawtooth wave according to a position controlled variable of the montage pattern; and
   mixing said fundamental parabolic wave and controlled sawtooth wave.

2. A method according to claim 1, further including a step for clamping the peak level of mixture of said parabolic wave and sawtooth wave to a predetermined potential.

3. A method according to claim 1, in which the maximum amplitude of said sawtooth wave is substantially four times that of said fundamental parabolic wave.

4. A method according to claim 1, in which said constant repetition frequency is a horizontal line-scanning frequency.

5. A method according to claim 1, in which said constant repetition frequency is a vertical field-scanning frequency.

6. A method according to claim 1, further including a step for superposing a DC potential proportional to the position controlled variable of the montage pattern on said sawtooth wave prior to amplitude control of said sawtooth wave.

7. A video special effect producing signal generating system for use in provision of a circular or elliptical montage pattern on the screen of a television cathode ray tube, the center position of the montage pattern being movable by a position control device, said system comprising:
   means for generating a fundamental parabolic wave with a fixed amplitude and phase at a constant repetition frequency;
   means for generating a sawtooth wave at said constant repetition frequency;
   means for controlling the amplitude of said sawtooth wave according to the position controlled variable of the montage pattern by means of said position control device; and
   means for mixing said fundamental parabolic wave and controlled sawtooth wave.

8. A system for controlling the phase of a continuous parabolic wave for use in provision of a circular or elliptical montage pattern on the screen of a television cathode ray tube to move the center position of the montage pattern by means of a position control device, said system comprising:
   means for generating a fundamental parabolic wave having a fixed amplitude and a symmetrical waveform at a constant repetition frequency;
   sawtooth wave generating means for generating a sawtooth wave at said constant repetition frequency;
   sawtooth wave controlling means for controlling the amplitude and polarity of said sawtooth wave according to the position controlled variable of the montage pattern; and
   mixing means for mixing said fundamental parabolic wave and controlled sawtooth wave.

9. A system according to claim 8, further including means connected to the output of said mixing means to clamp the peak level of the output of said mixing means to a predetermined potential.

10. A system according to claim 8, in which the output of said sawtooth wave generating means has an amplitude substantially four times that of said fundamental parabolic wave.

11. A system according to claim 8, in which said constant repetition frequency is a horizontal line-scanning frequency.

12. A system according to claim 8, in which said constant repetition frequency is a vertical field-scanning frequency.

13. A system according to claim 8, in which said sawtooth wave controlling means includes means for mixing, in a ratio dependent on the position controlled variable of the montage pattern, two sawtooth waves which are equal in amplitude and opposite in polarity to each other.

14. A system for controlling the phase of a continuous parabolic wave for use in provision of a circular or elliptical montage pattern on the screen of a television cathode ray tube to move the center position of the montage pattern by means of a position control device, said system comprising:
   means for generating at a constant repetition frequency a fundamental parabolic wave having a predetermined amplitude and a phase fixed such that the peak of said fundamental parabolic wave is positioned at one end of one cycle period;
   sawtooth wave generating means for generating at said constant repetition frequency a sawtooth wave which is substantially opposite in phase to said fundamental parabolic wave;

means for controlling the amplitude of said sawtooth wave according to the position controlled variable of the montage pattern; and mixing means for mixing said fundamental parabolic wave and amplitude-controlled sawtooth wave.

15. A system according to claim 14, further including means connected to the output of said mixing means to clamp the peak level of the output of said mixing means to a predetermined potential.

16. A system according to claim 14, in which said sawtooth wave output of said sawtooth wave generating means has an amplitude substantially twice that of said fundamental parabolic wave.

17. a system according to claim 14, in which said constant repetition frequency a horizontal line-scanning frequency.

18. A system according to claim 14, in which said constant repetitition frequency is a vertical field-scanning frequency.

19. A system for controlling the phase of a continuous parabolic wave for use in provision of a circular or elliptical montage pattern on the screen of a cathode ray tube to move the center position of the montage pattern by means of a position control device, said system comprising:

means for generating at a constant repetition frequency a fundamental parabolic wave having a predetermined amplitude and a phase fixed such that the peak of said fundamental parabolic wave is positioned at the center of one cycle period;

sawtooth wave generating means for generating a sawtooth wave at said constant repetition frequency;

means for superposing on said sawtooth wave a DC component whose potential varies dependent upon the position controlled variable of the montage pattern;

control means for controlling according to the position controlled variable of the montage pattern the amplitude and polarity of said sawtooth wave upon which said DC component has been superposed; and means for mixing the output of said control means and said fundamental parabolic wave.

20. A system according to claim 19, in which the output of said sawtooth wave generating means has an amplitude substantially four times that of said parabolic wave.

21. A system according to claim 19, in which said control means includes means for generating two sawtooth waves equal in amplitude and opposite in phase to each other, and means for mixing said two sawtooth waves in a ratio dependent on the position controlled variable of the montage pattern.

22. A system according to claim 19, in which said constant repetition frequency is a horizontal line-scanning frequency.

23. A system according to claim 19, in which said constant repetition frequency is a vertical field-scanning frequency.

24. A system for controlling the phase of a continuous parabolic wave for use in provision of a circular or elliptical montage pattern on the screen of a television cathode ray tube to move the center position of the montage pattern by means of a position control device, said system comprising:

means for generating at a constant repetition frequency a fundamental parabolic wave having a predetermined amplitude and a peak which is positioned at one end of one cycle period;

means for generating at said constant repetition frequency a sawtooth wave substantially opposite in phase to said fundamental parabolic wave;

means for superposing on said sawtooth wave a DC component whose potential varies dependent upon the position controlled variable of the montage pattern;

control means for controlling the amplitude of said sawtooth wave upon which said DC component has been superposed according to the position controlled variable of the montage pattern; and mixing means for mixing said fundamental parabolic wave and output of said control means.

25. A system according to claim 24 in which the sawtooth wave output of said sawtooth wave generating means has an amplitude substantially two times that of said parabolic wave.

26. A system according to claim 24 in which said constant repetition frequency is a horizontal line-scanning frequency.

27. A system according to claim 24 in which said constant repetition frequency is a vertical field-scanning frequency.

28. A method according to claim 1 wherein said step of controlling includes controlling both the amplitude and polarity of a sawtooth wave.

29. A system according to claim 7 wherein said means for controlling includes means for controlling both the amplitude and polarity of a sawtooth wave.

* * * * *